(12) United States Patent
Bernstein et al.

(10) Patent No.: US 7,898,078 B1
(45) Date of Patent: Mar. 1, 2011

(54) POWER CONNECTOR/DECOUPLER INTEGRATED IN A HEAT SINK

(75) Inventors: Kerry Bernstein, Underhill, VT (US); John E. Barth, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/568,837

(22) Filed: Sep. 29, 2009

(51) Int. Cl.
*H01L 23/36* (2006.01)

(52) U.S. Cl. ............................ 257/712; 438/123

(58) Field of Classification Search ............. 257/712, 257/738; 438/123
See application file for complete search history.

(56) References Cited

U.S. PATENT DOCUMENTS

| | | | |
|---|---|---|---|
| 3,551,758 A * | 12/1970 | Ferree | 257/714 |
| 5,014,159 A | 5/1991 | Butt | |
| 5,212,625 A * | 5/1993 | van Andel et al. | 361/690 |
| 5,386,339 A | 1/1995 | Polinski, Sr. | |
| 6,860,004 B2 | 3/2005 | Hirano et al. | |
| 7,059,042 B2 | 6/2006 | Hirano et al. | |

FOREIGN PATENT DOCUMENTS

WO   WO2004079792   9/2004

* cited by examiner

*Primary Examiner*—Roy K Potter
(74) *Attorney, Agent, or Firm*—Scully, Scott, Murphy & Presser, P.C.; David A. Cain, Esq.

(57) ABSTRACT

Two sets of conductor fins are formed on a topmost surface of stacked semiconductor chips. The two sets of conductor fins are electrically isolated from each other, and function as radiators that dissipate heat from the stacked semiconductor chips. Conductive wiring structures are formed on each set of conductor fins to supply electrical power and electrical grounding to the stacked semiconductor chips. The bottommost surface of the stacked semiconductor chips may be bonded to a packaging substrate. Since the semiconductor fins above provide electrical power supply and electrical grounding, a higher fraction of electrical connections between the bottommost surface of the stacked semiconductor chips and the packaging substrate may be employed for input and output signal transmission without adverse impact on heat dissipation of the stacked semiconductor chips. The conductive fins function as power connectors. Decoupling capacitors including the conductive fins and dielectric portions therebetween may be formed.

20 Claims, 5 Drawing Sheets

US 7,898,078 B1

POWER CONNECTOR/DECOUPLER INTEGRATED IN A HEAT SINK

BACKGROUND

The present invention generally relates to semiconductor structures, and particularly to a multi-chip stacked semiconductor structure including a power connector/decoupler integrated in a heat sink, and methods of manufacturing the same.

One of the impediments limiting three-dimensional integration of stacked semiconductor chips is the simultaneous requirement of heat removal from stacked semiconductor chips and application of power to the stacked semiconductor chips at the same time. One side of the stacked semiconductor chips is used for mounting the stack to a packaging substrate. The opposite side of the stacked semiconductor chip is typically employed to provide a set of radiator fins that eradiate heat, thereby increasing the maximum operational power consumption for the stacked semiconductor chip.

The number of electrical connections between the stacked semiconductor chips and the packaging substrate is limited by the number of solder connections between the packaging substrate and the bottommost semiconductor chip in the stack of semiconductor chips. The pitch of the array employed for the solder balls may be from 100 microns to 300 microns, and the total number of solder balls is typically limited to a number less than 10,000. Many of the solder balls are employed for providing electrical power or electrical grounding to the stacked semiconductor chips, thereby limiting the number of solder balls that may be employed to transmit input signals and output signals. To improve the functionality and to enable stacking of a large number of semiconductor chips, the number of solder pads available for transmitting input and output signals need to be increased, while the power generated from the stacked semiconductor chips need to be adequately dissipated.

BRIEF SUMMARY

The present invention addresses the needs described above by providing a heat sink that functions as a power connector, a power decoupler, or both, and methods of manufacturing the same.

In the present invention, two sets of conductor fins are formed on a topmost surface of stacked semiconductor chips. The two sets of conductor fins are electrically isolated from each other, and function as radiators that dissipate heat from the stacked semiconductor chips. Conductive wiring structures are formed on each set of conductor fins to supply electrical power and electrical grounding to the stacked semiconductor chips. The bottommost surface of the stacked semiconductor chips may be bonded to a packaging substrate. Since the semiconductor fins provide electrical power supply and electrical grounding, a higher fraction of electrical connections between the bottommost surface of the stacked semiconductor chips and the packaging substrate may be employed for input and output signal transmission without adverse impact on heat dissipation of the stacked semiconductor chips. The conductive fins function as power connectors. Decoupling capacitors including the conductive fins and dielectric portions therebetween may be formed.

According to an aspect of the present invention, a semiconductor structure is provided, which includes at least one semiconductor chip, each including at least one semiconductor device; at least one first conductive fin located on a first side of the at least one semiconductor chip and supplying a non-zero voltage to the at least one semiconductor device; and at least one second conductive fin located on the first side of the at least one semiconductor chip and electrically isolated from the at least one first conductive fin and supplying an electrical connection between the at least one semiconductor chip and electrical ground.

According to another aspect of the present invention, a method of forming a semiconductor structure is provided, which includes attaching at least one first conductive fin on a first side of at least one semiconductor chip including at least one semiconductor device, wherein the at least one first conductive fin is electrically connected to a power supply node of the at least one semiconductor device; and attaching at least one second conductive fin on the first side of the at least one semiconductor chip, wherein the at least one second conductive fin is electrically isolated from the at least one first conductive fin and is connected to electrical ground of the at least one semiconductor device.

DETAILED DESCRIPTION

Figure 1:
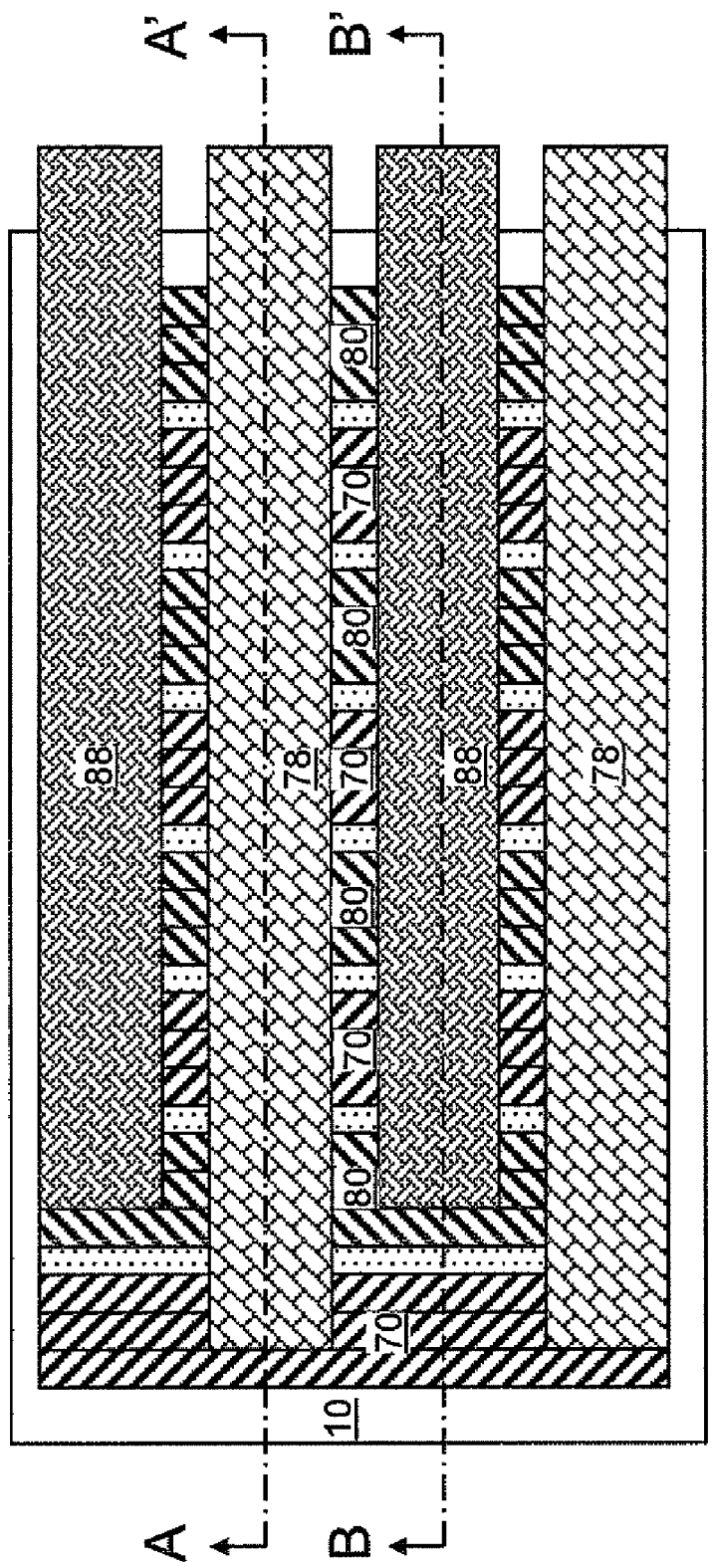
FIG. 1 is a top-down view of a first exemplary semiconductor structure according to the present invention.
Figure 2:
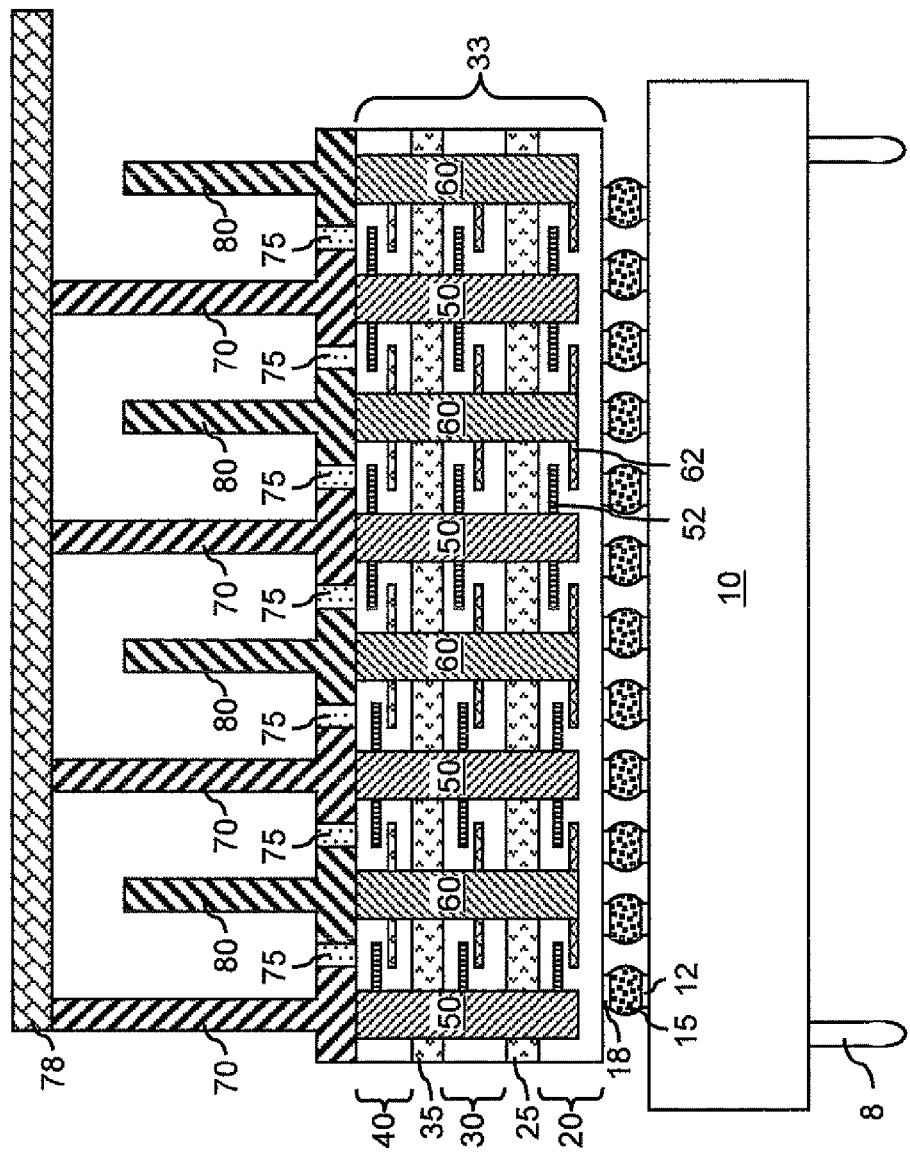
FIG. 2 is a vertical cross-sectional view of the first exemplary semiconductor structure along the plane A-A' shown in FIG. 1.
Figure 3:
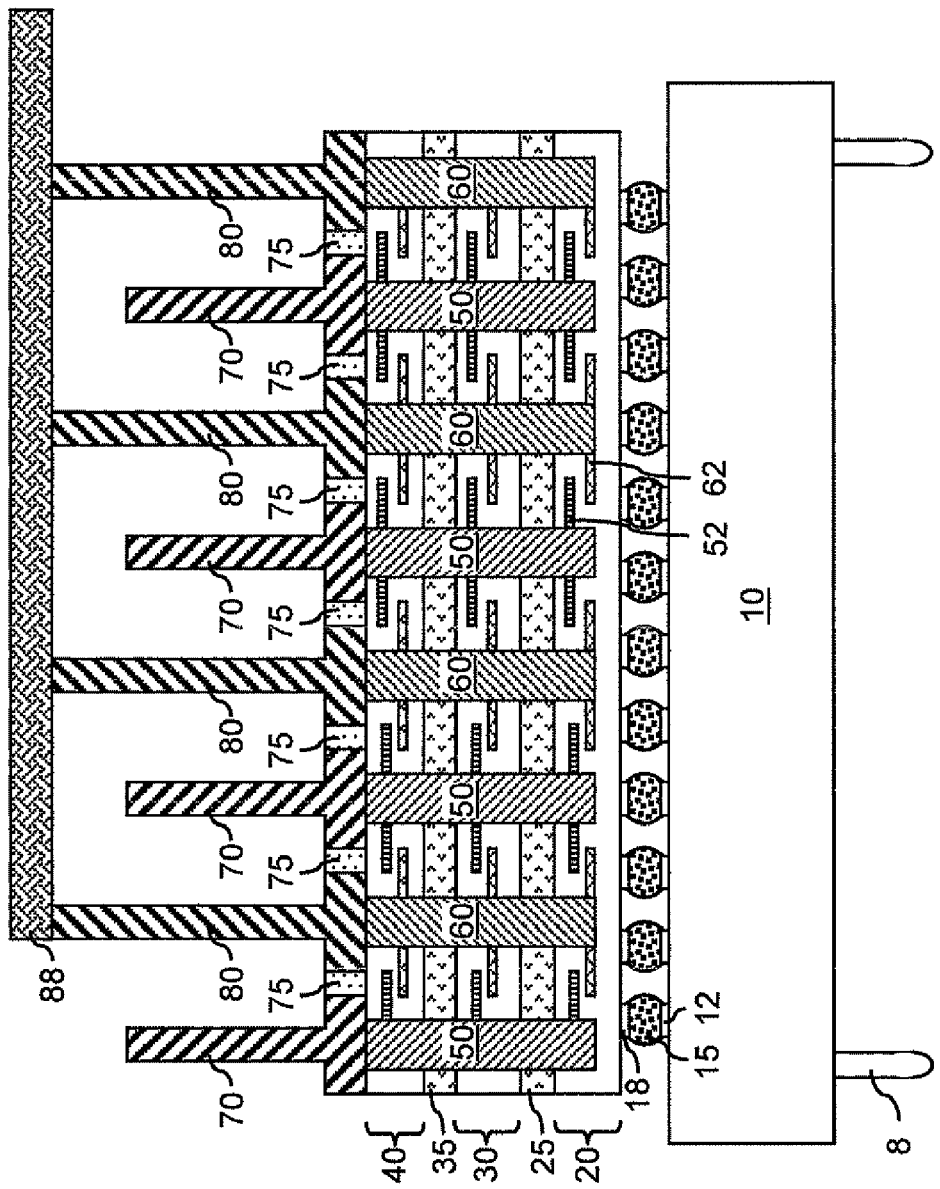
FIG. 3 is a vertical cross-sectional view of the first exemplary semiconductor structure along the plane B-B' shown in FIG. 1.
Figure 4:
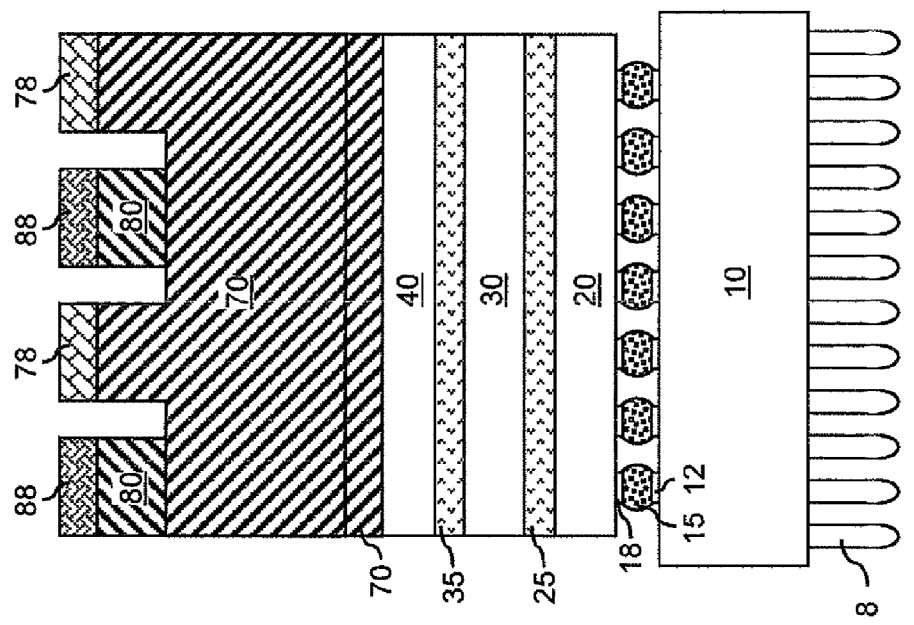
FIG. 4 is a side view of the first exemplary semiconductor structure in the direction along the plane A-A' in FIG. 1.

As stated above, the present invention relates to a multi-chip stacked semiconductor structure including a power connector/decoupler integrated in a heat sink and methods of manufacturing the same which are now described in detail with accompanying figures. Throughout the drawings, the same reference numerals or letters are used to designate like or equivalent elements. The drawings are not necessarily drawn to scale.

Referring to FIGS. 1-4, an exemplary semiconductor structure according to the present invention includes at least one semiconductor chip to which at least one first conductive fin 70 and at least one second conductive fin 80 are attached. First conductive bars 78 are attached directly to an upper end of each of the first conductive fins 70, and second conductive bars 88 are attached directly to an upper end of each of the second conductive fins 80. A packaging substrate 10 is bonded to the at least one semiconductor chip through an array of solder balls 15.

The at least one semiconductor chip may be a semiconductor chip stack, i.e., a stack of semiconductor chips, including at least two semiconductor chips. Typically, the at least two semiconductor chips are vertically stacked within the semiconductor chip stack 33. If the semiconductor chip stack 33 includes a vertical stack of three semiconductor chips, for example, the semiconductor chip stack 33 may include a first semiconductor chip 20 located at the bottom, a second semiconductor chip 30 located above the first semiconductor chip 20, and a third semiconductor chip 40 located above the second semiconductor chip 30.

Each of the at least one semiconductor chip (20, 30, 40) includes at least one semiconductor device formed on a semiconductor substrate, i.e., a substrate including a semiconductor material. Examples of the at least one semiconductor device include field effect transistors, bipolar junction transistors, diodes, capacitors, semiconductor resistors, capacitors. Further, each of the at least one semiconductor chip (20, 30, 40) includes power supply wiring structures 52 and electrical ground wiring structures 62 that form a power supply network and a ground wiring network, respectively, within each semiconductor chip. The power supply wiring structures 52 and the electrical ground wiring structures 62 typically include metal lines that provide electrical connections along horizontal directions and metal via structures that provide electrical connections along the vertical direction.

The semiconductor chip stack 33 includes at least one dielectric layer formed between a semiconductor chip and another semiconductor chip. Each dielectric layer vertically abuts a bottom surface of a semiconductor chip and a top surface of another semiconductor chip, thereby providing electrical isolation between the two semiconductor chips. If the at least one semiconductor chip is a vertical stack of three semiconductor chips, for example, a first dielectric layer 25 may be formed between the first semiconductor chip 20 and the second semiconductor chip 30, and a second dielectric layer 35 may be formed between the second semiconductor chip 30 and the third semiconductor chip 40. The dielectric layers (25, 35) include a dielectric material such as silicon oxide, silicon nitride, polyimide, or organic polymers.

First inter-chip conductive studs 50 may be formed within the semiconductor chip stack 33 through a plurality of semiconductor chips. The first inter-chip conductive studs 50 comprise a conductive material such as a metal or a metallic compound. The first inter-chip conductive studs 50 contact the power supply wiring structures 52 in the various semiconductor chip (20, 30, 40).

Second inter-chip conductive studs 60 may be formed within the semiconductor chip stack 33 through a plurality of semiconductor chips. The second inter-chip conductive studs 60 comprise a conductive material such as a metal or a metallic compound. The second inter-chip conductive studs 60 contact the electrical ground wiring structures 62 in the various semiconductor chips (20, 30, 40).

At least one first conductive fin 70 is formed on the first inter-chip conductive studs 50. Typically, the at least one first conductive fin 70 is a plurality of first conductive fins. The at least one first conductive fin 70 comprises a thermally conductive material such as a metal or a metallic compound. For example, the at least one first conductive fin 70 may comprise copper or aluminum. The at least one first conductive fin 70 directly contacts the first inter-chip conductive studs 50.

At least one second conductive fin 80 is formed on the second inter-chip conductive studs 60. Typically, the at least one second conductive fin 80 is a plurality of second conductive fins. The at least one second conductive fin 80 comprises a thermally conductive material such as a metal or a metallic compound. For example, the at least one second conductive fin 80 may comprise copper or aluminum. The at least one second conductive fin 80 directly contacts the second inter-chip conductive studs 60.

At least one first conductive bar 78 may be formed on the top surface(s) of the at least one first conductive fin 70. The at least one first conductive bar 78 may be attached to a top surface of each first conductive fin 70. The at least one first conductive bar 78 comprises a conductive material such as a metal or a metallic compound. In case the at least one first conductive fin 70 is a plurality of first conductive fins, the at least one first conductive bar 78 may contact multiple first conductive fins. The at least one first conductive bar 78 is electrically connected to a power supply source providing a non-zero voltage.

At least one first conductive bar 88 may be formed on the top surface(s) of the at least one second conductive fin 80. The at least one second conductive bar 88 may be attached to a top surface of each second conductive fin 80. The at least one second conductive bar 88 comprises a conductive material such as a metal or a metallic compound. In case the at least one second conductive fin 80 is a plurality of first conductive fins, the at least one second conductive bar 88 may contact multiple second conductive fins. The at least one second conductive bar 88 is electrically connected to electrical ground.

The at least one first conductive bar 78 and the at least one second conductive bar 88 are electrically disconnected from each other. The at least one first conductive bar 78 is resistively connected to power supply nodes of the at least one semiconductor device in the semiconductor chip stack 33, and the at least one second conductive bar 88 is resistively connected to electrical ground nodes of the at least one semiconductor device in the semiconductor chip stack 33. The at least one first conductive bar 78 is electrically connected to the power supply nodes through the at least one first conductive fin 70, and the at least one second conductive bar 88 is electrically connected to the electrical ground nodes of the at least one semiconductor device in the semiconductor chip stack 33 through the at least one second conductive fin 80.

In one embodiment, the at least one first conductive fin 70 has a notch underlying the at least one second conductive bar 88 to avoid making electrical contact with the at least one second conductive bar 88. If the entire structure is placed upside down, the notch of the at least one first conductive fin 70 may point downward and overlie the at least one second conductive bar 88. Likewise, the at least one second conductive fin 80 may a notch underlying the at least one first conductive bar 78 to avoid making electrical contact with the at least one first conductive bar 78. If the entire structure is placed upside down, the notch of the at least one second conductive fin 80 may point downward and overlie the at least one first conductive bar 78. In this case, the side view of each of the at least one first conductive fin 70 and the at least one second conductive fin 80 includes at least one indent from the top surface as exemplified in FIG. 4.

The at least one first conductive fin 70 and the at least one second conductive fin 80 may be interlaced to provide a high density of electrical power supply nodes in the semiconductor chip stack 33.

During the operation of the semiconductor devices in the semiconductor chip stack 33, the heat generated by the semiconductor devices is transferred to the at least one first conductive fin 70 and the at least one second conductive fin 80 through the first inter-chip conductive studs 50 and the second inter-chip conductive studs 60, respectively. The heat is radiated to the ambient from the at least one first conductive fin 70 and the at least one second conductive fin 80. Further, the at least one first conductive bar 78 and the at least one second conductive bar 88 may be employed to further transfer the heat to another heat sink (not shown).

The at least one first conductive fin 70 and the at least one second conductive fin 80 function as the paths for applying electrical power to the semiconductor devices in the semiconductor chip stack 33 and as the radiators for dissipating heat generated at the semiconductor devices in the semiconductor chip stack 33.

The semiconductor chip stack 33 may be bonded to the packaging substrate 10 through an array of solder balls 15 such as C4 balls. For example, first solder ball pads 12 may be formed on a top surface of the packaging substrate 10. An array of solder balls 15 is then formed on the first solder ball pads 12. Second solder ball pads 18 are formed on a bottom surface of the semiconductor chip stack 33. If the semiconductor chip stack 33 includes a vertical stack of three semiconductor chips (20, 30, 40), for example, the second solder ball pads 18 may be formed on the bottom surface of the first semiconductor chip. The array of solder balls 15 is then bonded to the second solder ball pads 18 to provide electrical connections between the packaging substrate 10 and the semiconductor chip stack 33. The order of bonding of the array of solder balls 15 may be reversed as needed, i.e., the array of solder balls 15 may be bonded to the second solder ball pads 18 first, and then bonded to the first solder ball pads 12.

The packaging substrate 10 is made of a dielectric material such as a ceramic material or an organic material. An array of metallic pins 8 is provided on the packaging substrate 10 to enable assembly on a board. Typically, the array of metallic pins 10 is located on an opposite side of the array of solder balls 15 relative to the packaging substrate 10.

The packaging substrate 10 may provide up to 10,000 input/out nodes, and typically less than 5,000 input/output nodes. Each of these nodes are electrically connected to a C4 pad among the first solder ball pads 12 in a two dimensional array. Typical two dimensional array configurations for the array of the first solder ball pads 12 include the "4 on 8 configuration," which employs C4 solder balls having a diameter of 4 mils (~100 microns) and a pitch of 8 mils (~200 microns) in a rectangular array, and the "3 on 6 configuration," which employs C4 solder balls having a diameter of 3 mils (~75 microns) and a pitch of 6 mils (~150 microns) in a rectangular array.

Due to the finite size of each solder ball, the number of the first solder ball pads 12 that may be farmed on the packaging substrate 10 is limited, which is typically smaller than about 2.5 cm×2.5 cm in size. The same limitation on the number of C4 pads applies to the second solder ball pads 18 as well since the semiconductor chips in the semiconductor chip stack 33 are typically smaller than about 2.0 cm×2.0 cm in size. The semiconductor chip stack 33 is mounted on a die foot print area of the packaging substrate 10. The die foot print area is the area of the second solder ball pads 18 on the semiconductor chip stack 33.

The array of solder balls 15 may comprise leaded solder or lead-free solder. For lead-free solder, Sn—Ag—Cu alloys may be employed. The diameter of each solder ball may be from 50 microns to 125 microns, and typically from 75 microns to 100 microns.

The packaging substrate 10 protects the semiconductor chip stack 33 and modularizes the product development of the semiconductor chip, while simplifying the subsequent integration steps involved in the manufacturing of a larger computer or a consumer electronic product. The packaging substrate 10 includes metal wiring levels (not shown) which function as signal routing paths between the second solder ball pads 18 and the array of metallic pins 8. Ceramic materials or organic materials may be employed for building up a substrate. Such ceramic substrates are built layer by layer without the need of a core whereas an organic substrate requires a core on which the front and back layers can be built. Ceramic materials offer excellent mechanical strength and a low level of warp relative to organic materials. An organic substrate facilitates high density and requires a lesser level of metal interconnect layers. Typically, an organic substrate may include about 20 metal wiring levels, while a ceramic substrate may include about 100 metal wiring levels.

By providing power to the semiconductor devices through the first conductive bars 78, the second conductive bars 88, the first conductive fins 70, the second conductive fins, the first inter-chip conductive studs 50, and the second inter-chip conductive studs 60, less number of solder balls within the array of solder balls 15 are required for providing electrical connection to power supply nodes and electrical ground nodes in the semiconductor chip stack 33.

If the first conductive bars 78, the second conductive bars 88, the first conductive fins 70, the second conductive fins, the first inter-chip conductive studs 50, and the second inter-chip conductive studs 60 provide electrical connections to all of the power supply nodes and the electrical ground nodes in the semiconductor chip stack 33, all of the solder balls in the array of solder balls 15 may be employed to transmit signals. Since the power requirement for solder balls employed for transmitting input/output signals is less than the power requirement for solder balls employed for providing electrical connections to the power supply nodes and the electrical ground nodes, the size of the solder balls may be decreased and the total number of input/output nodes may be increased to enable integration of more semiconductor chips and semiconductor devices in the semiconductor chip stack 33.

Optionally, dielectric material portions 75 may be formed between the at least one first conductive fin 70 and at least one second conductive fin 80. Each dielectric material portion 75 is located between a neighboring pair of a first conductive fin 70 and a second conductive fin 80. Each dielectric material portion 75 abuts a first conductive fin 70 and a second conductive fin 80. For each first conductive fin 70 that abuts a dielectric material portion 75, a first end of the first conductive fin 70 abuts the dielectric material portions 75 and a first inter-chip conductive stud 50. A second end of the first conductive fin 70, which is located on the opposite end of the first conductive fin 70, abuts the at least one first conductive bar 78. For each second conductive fin 80 that abuts the dielectric material portion 75, a first end of the second conductive fin 80 abuts the dielectric material portions 75 and a second inter-chip conductive stud 60. A second end of the second conductive fin 80, which is located on the opposite end of the second conductive fin 80, abuts the at least one second conductive bar 88.

The dielectric material portions 75 include a dielectric material such as silicon oxide, silicon nitride, polyimide, or an organic polymer. Preferably, the dielectric material portions 75 comprise a dielectric material having a high dielectric constant such as silicon nitride, which has a dielectric constant of about 8.0.

A contiguous set of a first conductive fin 70, a dielectric material portion 75, and a second conductive fin 80 constitutes a capacitor, in which the first conductive fin 70 and the second conductive fin 80 are conductive nodes and the dielectric material portion 75 is a node dielectric. The spacing between the first conductive fin 70 and the second conductive fin 80 may be controlled to a minimum controllable dimension for alignment of the first conductive fin 70 and the second conductive fin 80 so that electrical isolation between the first and second semiconductor fins (70, 80) is insured, while providing high capacitance for the capacitor. A high dielectric constant for the dielectric material portion 75 increases the capacitance of the capacitor.

The capacitor decouples the alternating current component and the direct current component in the power supplied to the semiconductor devices through the at least one first semiconductor fin 70 and the at least one second semiconductor fin 80.

In other words, the capacitor is a decoupler that reduces voltage fluctuations in the power supply node and the electrical ground node of the semiconductor devices in the semiconductor chip stack 33. Thus, the first exemplary structure provides not only electrical power supply and dissipation of heat to the semiconductor chip stack 33, but a decoupler for the electrical power supply as well to stabilize the power supply voltage.

Figure 5:
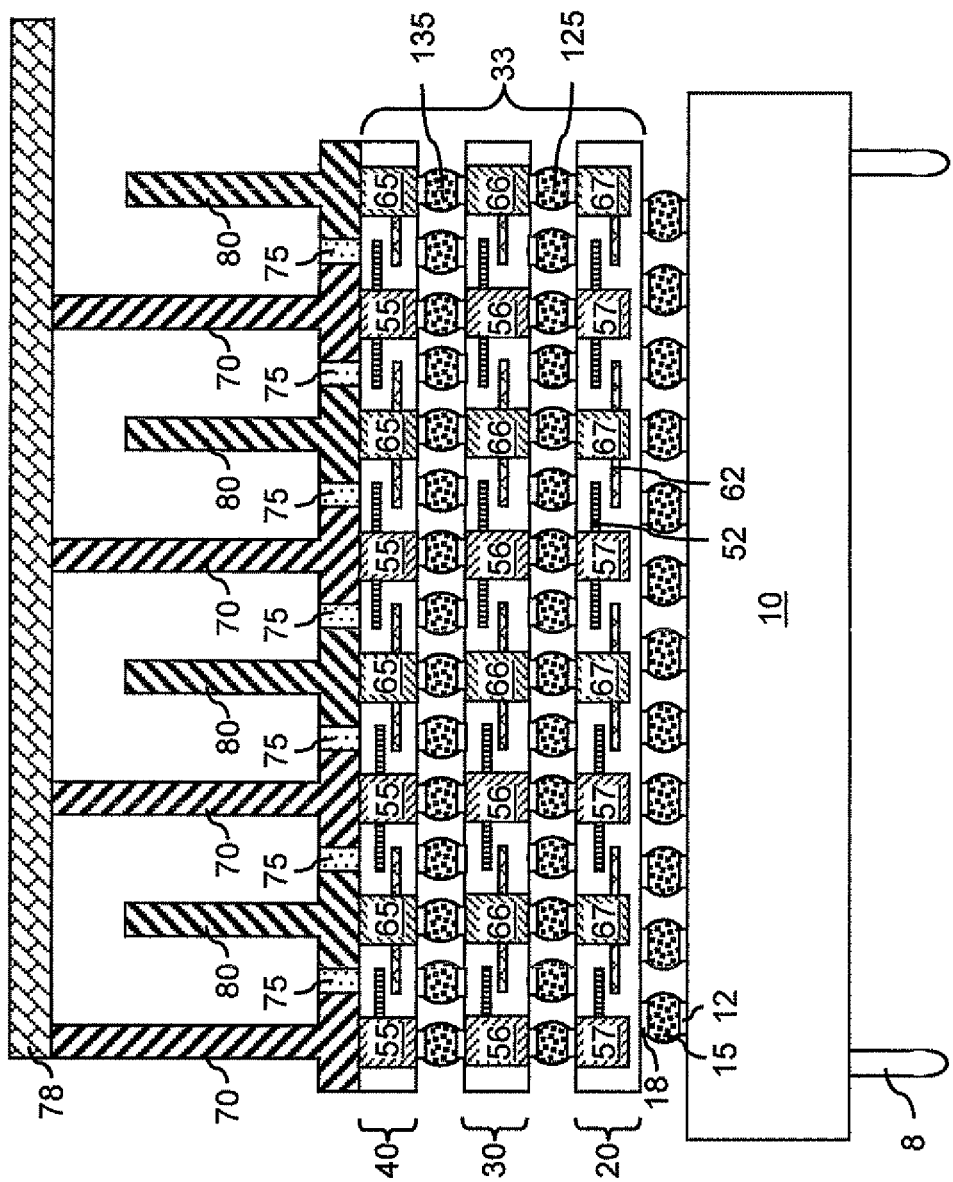
FIG. 5 is a vertical cross-sectional view of a second exemplary semiconductor structure.

Referring to FIG. 5, a second exemplary semiconductor structure according to a second embodiment of the present invention is shown. The semiconductor chips (20, 30, 40) in the semiconductor chip stack 33 are bonded among one another employing additional solder balls such as C4 balls. For example, a set of solder ball pads may be formed on a top surface of the first semiconductor chip 20 and an array of inter-chip solder balls 125 may be formed on the set of solder ball pads. Another set of solder ball pads may be formed on the bottom surface of the second semiconductor chip 30 that overlies the first semiconductor chip 20. The array of inter chip solder balls 125 is then bonded to the other set of solder ball pads on the second semiconductor chip 30 to provide electrical connections between the first semiconductor chip 20 and the second semiconductor chip 30. Similarly, another array of inter-chip solder balls 135 may be employed to provide electrical connections between the second semiconductor chip 30 and the third semiconductor chip 40. The second semiconductor chip 30 is vertically spaced from the first semiconductor chip 20 and the third semiconductor chip 40. Air flow may be provided through the gaps between adjacent semiconductor chips to facilitate removal of heat.

As in the first exemplary semiconductor structure, each of the at least one semiconductor chip (20, 30, 40) may include power supply wiring structures 52 and electrical ground wiring structures 62. Within each semiconductor chip, the power supply wiring structures 52 form a power supply network and the electrical ground wiring structures 62 form a ground wiring network, respectively. The power supply wiring structures 52 and the electrical ground wiring structures 62 typically include metal lines that provide electrical connections along horizontal directions and metal via structures that provide electrical connections along the vertical direction.

First conductive studs may be formed within each semiconductor chip to provide electrical connection from the power supply nodes in the semiconductor chips to the at least one first conductive fin 70. If the semiconductor chip stack 33 includes a vertical stack of three semiconductor chips, for example, the first conductive studs may include first-chip first conductive studs 57, second-chip first conductive studs 56, and third-chip first conductive studs 55. The first conductive studs (55, 56, 57) may be electrically connected among multiple semiconductor chips by solder balls in arrays of inter-chip solder balls (125, 135).

Likewise, second conductive studs may be formed within each semiconductor chip to provide electrical connection from the electrical ground nodes in the semiconductor chips to the at least one second conductive fin 80. If the semiconductor chip stack 33 includes a vertical stack of three semiconductor chips, for example, the second conductive studs may include first-chip second conductive studs 67, second-chip second conductive studs 66, and third-chip second conductive studs 65. The second conductive studs (65, 66, 67) may be electrically connected among multiple semiconductor chips by solder balls in arrays of inter-chip solder balls (125, 135).

The top surfaces of the first conductive pads in the topmost semiconductor chip contact the bottom surfaces of the at least one first conductive fin 70. If the semiconductor chip stack 33 includes a vertical stack of three semiconductor chips, for example, the top surfaces of the third-chip first conductive studs 55 contact the at least one first conductive fin 70. The top surfaces of the at least one first conductive fin 70 may be connected to the at least one first conductive bar 78, which is electrically connected to a power supply that provides a non-zero voltage.

Likewise, the top surfaces of the second conductive pads in the topmost semiconductor chip contact the bottom surfaces of the at least one second conductive fin 80. If the semiconductor chip stack 33 includes a vertical stack of three semiconductor chips, for example, the top surfaces of the third-chip second conductive studs 65 contact the at least one second conductive fin 80. The top surfaces of the at least one second conductive fin 80 may be connected to the at least one second conductive bar 88, which is electrically connected to electrical ground.

By providing electrical power through the at least one first conductive fin 70 and the at least one second conductive fin 80, the size of the solder balls between the packaging substrate 10 and the semiconductor chip stack 33 may be decreased and the total number of input/output nodes for the semiconductor chip stack 33 may be increased to enable integration of more semiconductor chips and semiconductor devices within the semiconductor chip stack 33.

Optionally, dielectric material portions 75 may be formed between the at least one first conductive fin 70 and at least one second conductive fin 80 in the same manner as in the first embodiment. Each dielectric material portion 75 is located between a neighboring pair of a first conductive fin 70 and a second conductive fin 80. Each dielectric material portion 75 abuts a first conductive fin 70 and a second conductive fin 80. For each first conductive fin 70 that abuts a dielectric material portion 75, a first end of the first conductive fin 70 abuts the dielectric material portions 75 and a third-chip first conductive stud 55. For each second conductive fin 80 that abuts the dielectric material portion 75, a first end of the second conductive fin 80 abuts the dielectric material portions 75 and a third-chip second conductive stud 65. The dielectric material portions 75 may comprise the same dielectric material as in the first embodiment.

As in the first embodiment, a contiguous set of a first conductive fin 70, a dielectric material portion 75, and a second conductive fin 80 constitutes a capacitor, in which the first conductive fin 70 and the second conductive fin 80 are conductive nodes and the dielectric material portion 75 is a node dielectric. The capacitor decouples the alternating current component and the direct current component in the power supplied to the semiconductor devices through the at least one first semiconductor fin 70 and the at least one second semiconductor fin 80.

While the present invention has been described with two types of conductive fins, i.e., at least one first conductive fin 70 and the at least one second conductive fin 80, that are employed for supplying a non-zero electrical voltage and connecting to electrical ground, respectively, embodiments of the present invention are explicitly contemplated in which additional types of conductive fins are formed to supply different non-zero electrical voltages. In this case, additional conductive bars may be formed and attached directly to an upper end of each of the additional types of conductive fins.

For example, at least one third conductive fin (not shown) may be formed directly on a topmost semiconductor chip of the semiconductor chip stack 33. At least one third conductive bar (not shown) may be formed directly on the at least one third conductive fin. The set of the at least one third conductive fin and the at least one third conductive bar may be employed a second non-zero electrical voltage to the semiconductor chip stack 33. The second non-zero electrical voltage is at a different electrical potential relative to the non-zero electrical voltage applied to the at least one first conductive fin 70. The set of the at least one third conductive fin and the at least one third conductive bar is electrically isolated from the at least one first conductive fin 70 and the at least one second conductive fin 80.

In a similar manner, any finite number of additional non-zero voltages may be supplied by providing additional set of conductive fins and optionally, accompanying conductive bars. Such extensions of the present invention are explicitly contemplated herein.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
    at least one semiconductor chip, each including at least one semiconductor device;
    at least one first conductive fin located on a first side of said at least one semiconductor chip and supplying a non-zero voltage to said at least one semiconductor device; and
    at least one second conductive fin located on said first side of said at least one semiconductor chip and electrically isolated from said at least one first conductive fin and supplying an electrical connection between said at least one semiconductor chip and electrical ground.

2. The semiconductor structure of claim 1, further comprising:
    an array of solder balls located on a second side of said at least one semiconductor chip, wherein said second side is located opposite to said first side; and
    a packaging substrate to which said at least one semiconductor chip is bonded through said array of solder balls.

3. The semiconductor structure of claim 2, further comprising an array of metallic pins located on said packaging substrate, wherein said packaging substrate comprises a ceramic material or an organic material, and wherein said array of metallic pins is located on an opposite side of said array of solder balls relative to said packaging substrate.

4. The semiconductor structure of claim 1, further comprising:
    at least one first conductive bar contacting a top surface of said at least one first conductive fin; and
    at least one second conductive bar contacting a top surface of said at least one second conductive fin.

5. The semiconductor structure of claim 4, wherein each of said at least one first conductive bar does not contact said at least one second conductive fin, and wherein each of said at least one second conductive bar does not contact said at least one first conductive fin.

6. The semiconductor structure of claim 4, wherein said at least one first conductive fin comprises a notch underlying or overlying said at least one second conductive bar, and wherein said at least one second conductive fin comprises a notch underlying or overlying said at least one first conductive bar.

7. The semiconductor structure of claim 1, further comprising a set of dielectric material portions, wherein each dielectric material portion is located between one of said at least one first conductive fin and one of said at least one second conductive fin.

8. The semiconductor structure of claim 7, wherein each dielectric material portion abuts one of said at least one first conductive fin and one of said at least one second conductive fin, and wherein a first end of a conductive fin abuts a dielectric material portion and a second end of said conductive fin abuts a conductive bar.

9. The semiconductor structure of claim 1, further comprising at least one additional conductive fin set located on said first side of said at least one semiconductor chip, wherein each of said at least one additional conductive fin set supplies an additional non-zero voltage to said at least one semiconductor device, wherein said additional non-zero voltage is different from said non-zero voltage.

10. The semiconductor structure of claim 1, wherein said at least one semiconductor chip is a stack of semiconductor chips, wherein at least two semiconductor chips are vertically stacked within said stack of semiconductor chips.

11. The semiconductor structure of claim 10, further comprising:
    first inter-chip conductive studs extending through a plurality of semiconductor chips and contacting said at least one first conductive fin; and
    second inter-chip conductive studs extending through said plurality of conductor chips and contacting said at least one second conductive fin.

12. The semiconductor structure of claim 10, wherein said stack of semiconductor chips includes at least one dielectric layer vertically abutting a bottom surface of a semiconductor chip and a top surface of another semiconductor chip.

13. The semiconductor structure of claim 10, wherein said stack of semiconductor chips includes an array of solder balls electrically connecting a semiconductor chip and another semiconductor chip.

14. A method of forming a semiconductor structure comprising:
    attaching at least one first conductive fin on a first side of at least one semiconductor chip including at least one semiconductor device, wherein said at least one first conductive fin is electrically connected to a power supply node of said at least one semiconductor device; and
    attaching at least one second conductive fin on said first side of said at least one semiconductor chip, wherein said at least one second conductive fin is electrically isolated from said at least one first conductive fin and is connected to electrical ground of said at least one semiconductor device.

15. The method of claim 14, further comprising attaching a packaging substrate on a second side of said at least one semiconductor chip, wherein said second side is opposite to said first side.

16. The method of claim 15, wherein said packaging substrate is attached to said second side of said at least one semiconductor chip through an array of solder balls, wherein said packaging substrate comprises a ceramic material or an organic material, and wherein an array of metallic is attached to said packaging substrate.

17. The method of claim 14, further comprising:
    attaching at least one first conductive bar to a top surface of one of said at least one first conductive fin; and
    attaching at least one second conductive bar to a top surface of each conductive fin among said at least one second conductive fin.

18. The method of claim 17, wherein said at least one first conductive bar is electrically connected to a power supply source providing a non-zero voltage, and wherein said at least one second conductive bar is electrically connected to electrical ground.

19. The method of claim 14, wherein said at least one semiconductor chip is a vertical stack of at least two semiconductor chips.

20. The method of claim 19, further comprising:
  forming first inter-chip conductive studs extending through a plurality of semiconductor chips, wherein said at least one first conductive fin contacts said first inter-chip conductive studs; and forming second inter-chip conductive studs extending through said plurality of conductor chips, wherein said at least one second conductive fin contacts said second inter-chip conductive studs.

* * * * *